(12) United States Patent
Kajigaya et al.

(10) Patent No.: US 6,882,557 B2
(45) Date of Patent: Apr. 19, 2005

(54) SEMICONDUCTOR MEMORY DEVICE

(75) Inventors: Kazuhiko Kajigaya, Tokyo (JP);
Hiromasa Noda, Tokyo (JP); Shinichi Miyatake, Tokyo (JP); Riichiro Takemura, Tokyo (JP); Tomonori Sekiguchi, Tokyo (JP); Takeshi Sakata, Tokyo (JP)

(73) Assignees: Elpida Memory, Inc.; Hitachi Ulsi Systems Co., Ltd.; Hitachi, Ltd.

( * ) Notice: Subject to any disclaimer, the term of this patent is extended or adjusted under 35 U.S.C. 154(b) by 0 days.

(21) Appl. No.: 10/656,351

(22) Filed: Sep. 5, 2003

(65) Prior Publication Data
US 2004/0184304 A1 Sep. 23, 2004

(30) Foreign Application Priority Data
Sep. 5, 2002 (JP) ....................... 2002-260279

(51) Int. Cl.[7] .................................... G11C 5/06
(52) U.S. Cl. ............................ 365/63; 365/51
(58) Field of Search ..................... 365/145, 63, 51, 365/69, 72, 230.04

(56) References Cited

U.S. PATENT DOCUMENTS 6,272,054 B1   8/2001   Barth, Jr. et al. ........ 365/189.06
6,344,990 B1   2/2002   Matsumiya et al. .......... 365/63
6,400,596 B1 * 6/2002   Takemura et al. ............ 365/63

FOREIGN PATENT DOCUMENTS

JP          2001-143463      5/2001   ........... G11C/11/34

* cited by examiner

Primary Examiner—Michael S. Lebentritt
Assistant Examiner—Hien Nguyen
(74) Attorney, Agent, or Firm—Hayes Soloway P.C.

(57) ABSTRACT

The contact resistance of each switch is reduced, and the on-resistances of all of the switches are set to be uniform, while the area required for arrangement of bit line selection switches is not increased.

The switches are connected to one-side ends of the bit lines provided at the odd-numbered positions, and are connected to the other-side ends of the bit lines provided at the even-numbered positions. A pair of odd-numbered or even-numbered bit lines are connected to the terminals of each sense amplifier, respectively. The memory cells are arranged at predetermined intersection points of the word lies and the bit lines, the number of the predetermined intersection points being equal to half of all the intersection points thereof, in such a manner that when one word line is selected, the memory cells connected to the selected word-line can be electrically connected in such a manner that one memory cell is electrically connected to each terminal of the unit circuits.

13 Claims, 14 Drawing Sheets

| WORD LINE NO. | | | | CONTROL LINE NO. | | | |
|---|---|---|---|---|---|---|---|
| 11-0 | 11-1 | 11-2 | 11-3 | 15-a | 15-b | 15-c | 15-d |
| O |  |  |  | O |  | O |  |
|  | O |  |  |  | O | O |  |
|  |  | O |  |  | O |  | O |
|  |  |  | O | O |  |  | O |

| WORD LINE NO. | | | | CONTROL LINE NO. | | | |
|---|---|---|---|---|---|---|---|
| 0 | 1 | 2 | 3 | a | b | c | d |
| O |  |  |  | O | O | O | O |
|  | O |  |  | O | O | O | O |
|  |  | O |  | O | O | O | O |
|  |  |  | O | O | O | O | O |

TWIN CELL OPERATION

FIG. 13A

| WORD LINE NO. | | | | CONTROL LINE NO. | | | | | | | |
|---|---|---|---|---|---|---|---|---|---|---|---|
| 0 | 1 | 2 | 3 | a | a' | b | b' | c | c' | d | d' |
| O |   |   |   | O | O |   |   | O | O |   |   |
|   | O |   |   |   |   | O | O | O | O |   |   |
|   |   | O |   |   |   | O | O |   |   | O | O |
|   |   |   | O | O | O |   |   |   |   | O | O |

SINGLE CELL OPERATION (1)

FIG. 13B

| WORD LINE NO. | | | | CONTROL LINE NO. | | | | | | | |
|---|---|---|---|---|---|---|---|---|---|---|---|
| 0 | 1 | 2 | 3 | a | a' | b | b' | c | c' | d | d' |
| O |   |   |   | O |   |   | O | O |   |   | O |
|   | O |   |   | O |   |   | O | O |   |   | O |
|   |   | O |   | O |   |   | O | O |   |   | O |
|   |   |   | O | O |   |   | O | O |   |   | O |

SINGLE CELL OPERATION (2)

FIG. 13C

| WORD LINE NO. | | | | CONTROL LINE NO. | | | | | | | |
|---|---|---|---|---|---|---|---|---|---|---|---|
| 0 | 1 | 2 | 3 | a | a' | b | b' | c | c' | d | d' |
| O |   |   |   |   | O | O |   |   | O | O |   |
|   | O |   |   |   | O | O |   |   | O | O |   |
|   |   | O |   |   | O | O |   |   | O | O |   |
|   |   |   | O |   | O | O |   |   | O | O |   |

SEMICONDUCTOR MEMORY DEVICE

BACKGROUND OF THE INVENTION

1. Field of the Invention

The present invention relates to a semiconductor memory device, and particularly to a quarter-pitch two intersection-point twin cell array type semiconductor memory device.

2. Description of the Related Art

Figure 1:
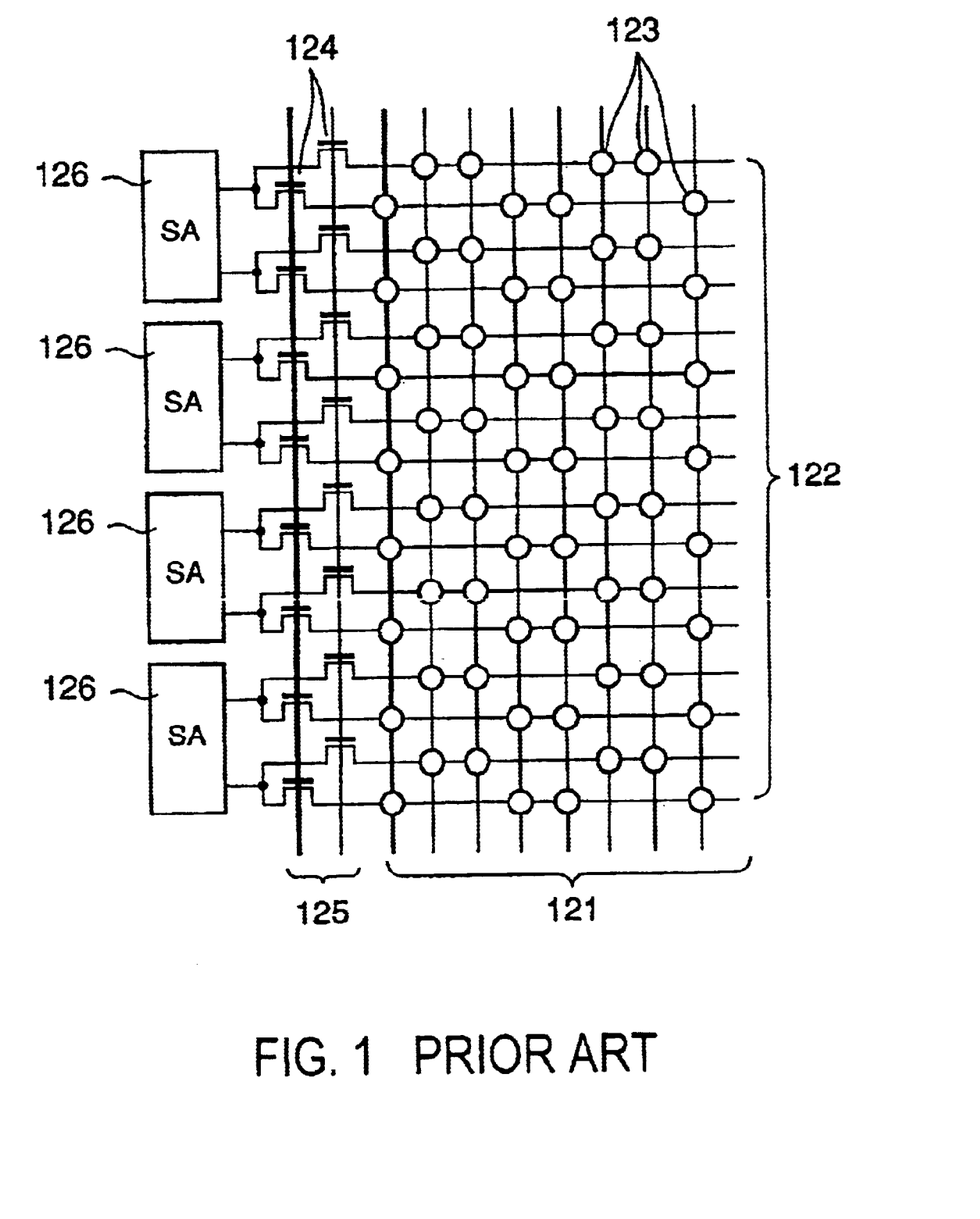
FIG. 1 schematically shows the configuration of an example of a conventional semiconductor memory device.

FIG. 1 shows an example of conventional memory devices. The semiconductor memory device comprises a plurality of word-lines 121 arranged in a predetermined direction (upper-lower direction in FIG. 1) and in parallel to each other, a plurality of bit lines 122 arranged orthogonally to the word lines 121 and in parallel to each other, a plurality of memory-cells 123 (represented by circular marks) provided at predetermined intersection points of a plurality of the word-lines and a plurality of the bit lines, the number of the predetermined intersection points being equal to half of all of the intersection points, a plurality of switches 124 connected to one-side ends (left-hand side in FIG. 1) of a plurality of the bit lines 122, a pair of control-lines 125, one of the control lines 125 being commonly connected to the bit lines 122 provided at the odd-numbered positions counted from the lowest bit line in FIG. 1, the other thereof being commonly connected to the bit lines 122 provided at the even-numbered positions, and a plurality of sense-amplifiers (SA) 126 each connected to two pairs of bit-lines (four bit lines) 122 via a plurality of the switches 124.

In this semiconductor memory device, when one of the control lines 125 is selectively driven by means of a control-line drive circuit (not shown), and moreover, any one of the word lines 121 is selectively driven by means of a word-line drive circuit (not shown), a pair of memory cells 123 Are electrically connected to each sense amplifier 126. For eagle, when the left-side line of the two control lines 125, represented by the bold line in FIG. 1, and also, the word line 121 positioned on the left-side end is selected, the memory cells 123 connected to the bit lines 122 first-numbered and third-numbered counted from the lowest bit-line are connected to the sense amplifier 126 provided at the lowest position. Each sense amplifier 126 writes complementary information corresponding to one bit in the pair of the memory cells 123, or reads the information therefrom.

In the semiconductor memory device of FIG. 1, the memory cells 123 are used in such a manner that two memory cells operate as one set, as described ave. Thus, the device is called a twin-cell array. Moreover, in this semiconductor memory device, the word line 121 for selection of a pair of two memory cells 123 intersects two bit lines 122 for selection of the memory cells 123. Thus, the device is called a two intersection point type. Moreover, it can be assumed that memory cells 123 are arranged in the bit line direction, in a repeated unit (one pitch) based on the intersection points of one bit line and four word lines. In this case, the memory cells 123 connected to each bit line 122 adjacent to the above-described bit line are arranged so as to be shifted by half of the pitch. Accordingly, this device is called a half pitch type.

This type semiconductor memory device is described, e.g., in U.S. Pat. No. 6,272,054 B1.

To increase the memory capacitance per unit area (for high integration and high capacitance) in the semiconductor memory device, it is required to reduce the intervals between the bit lines an much as possible. Moreover, regarding the switches connected to the bit lines, it is also required to configure or arrange the switches (or the bit line selection switches) so that the intervals between the bit lines are prevented from increasing. Thus, in the conventional semiconductor memory device, the bit line selection switches are configured or arranged as shown in FIG. 2.

Figure 2:
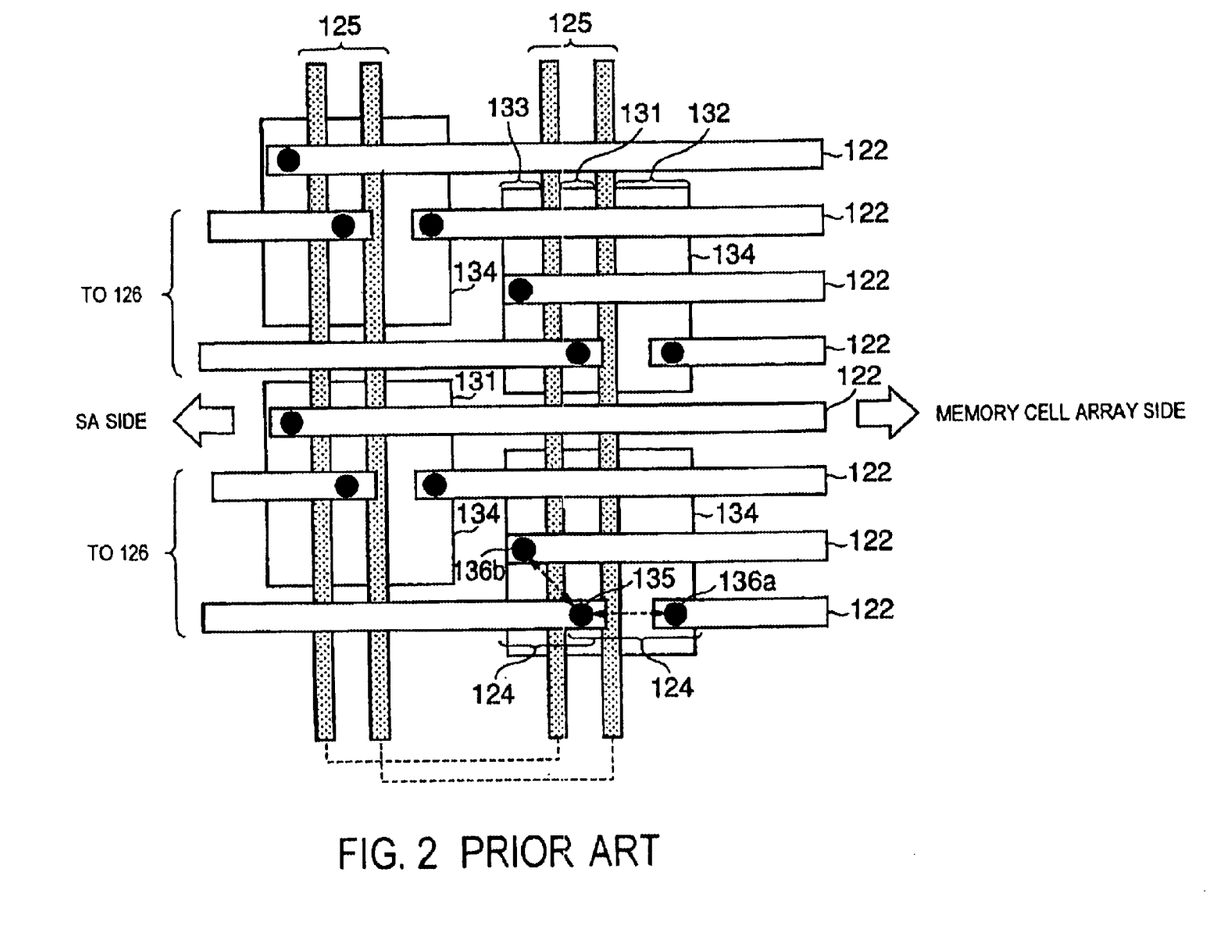
FIG. 2 shows a layout of the switches in the semiconductor memory device shown in FIG. 1.

In particular, according to the switch layout shown in FIG. 2, two adjacent switches 124 are formed as a two-integration type MOS transistor switch 134 which comprises a common source region 131 and drain regions 132 and 133 independent from each other. The integration type MOS transistor switches 134 are arranged in two columns. Thus, the bit lines 122 are formed at the smallest possible interval (pitch), and a plurality of the switches 124 are made to coordinate with the small intervals.

However, in the conventional switch layout, spaces required for formation of dog-bones in the peripheries of contacts 135, 136a, and 136b to reduce the contact resistances. The contact 135 is provided on the integration type MOS transistor switch 134 to connect the switch 134 to a connection line extended to the sense amplifier 126. The contacts 136a and 136b are provided on the integration type MOS transistor switch 134 to connect the switch 134 to the bit lines. Therefore, it is needed to reduce the sizes of the contact-holes or to provide contacts having plugs made of, e.g., a polysilicon with a relatively high resistance. Accordingly, the conventional semiconductor memory devices have problems in that the contact resistant of the switches 124 are large, so that the operating speed has a limitation.

Moreover, according to the conventional switch layout, the distance between the contact 135 for connection of the connection line to the sense amplifier 126 and the contact 136a, i.e., one of the contacts for connection of the bit lines 122 is different from the distance between the contact 135 and the other contact 136b, in the respective integration-type MOS transistor switches 134, as seen in the both-directional broken line arrows in FIG. 2. Therefore, the on-resistances of the two switches 124 of each integration type MOS transistor switch 134 are different from each other. This causes a difference between the operating speeds. Problems occur in that the margin for the operating timing design is reduced.

Figure 3:
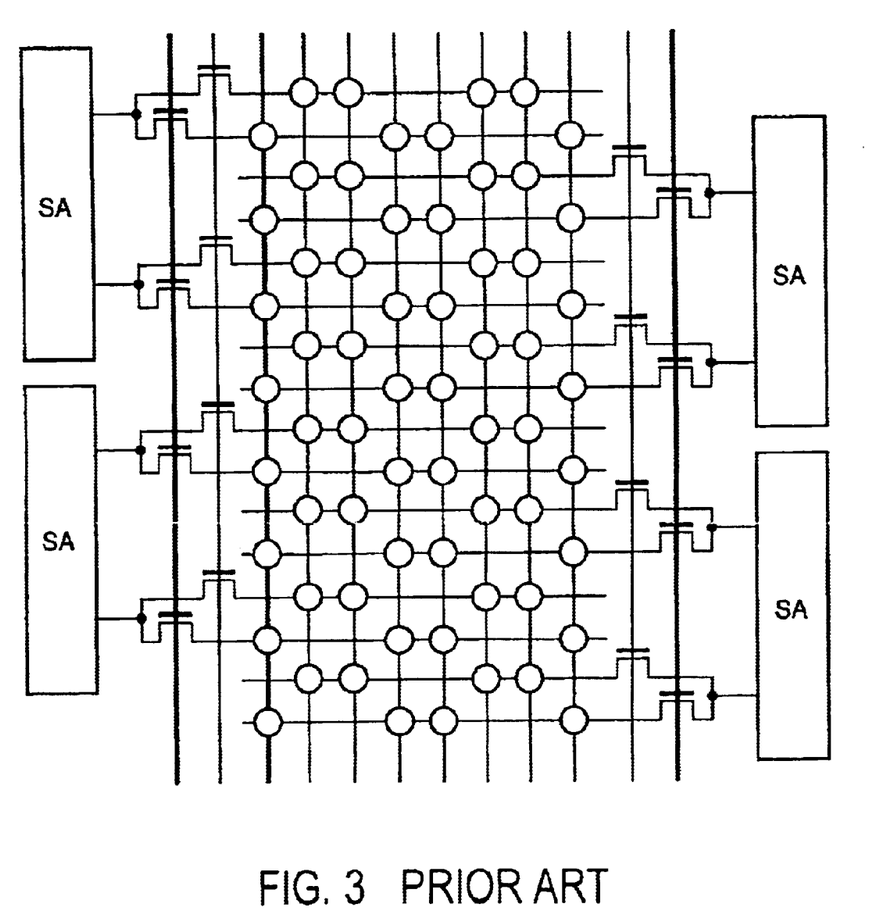
FIG. 3 schematically shows the configuration of the semiconductor memory device of FIG. 1 which has been improved.
Figure 4:
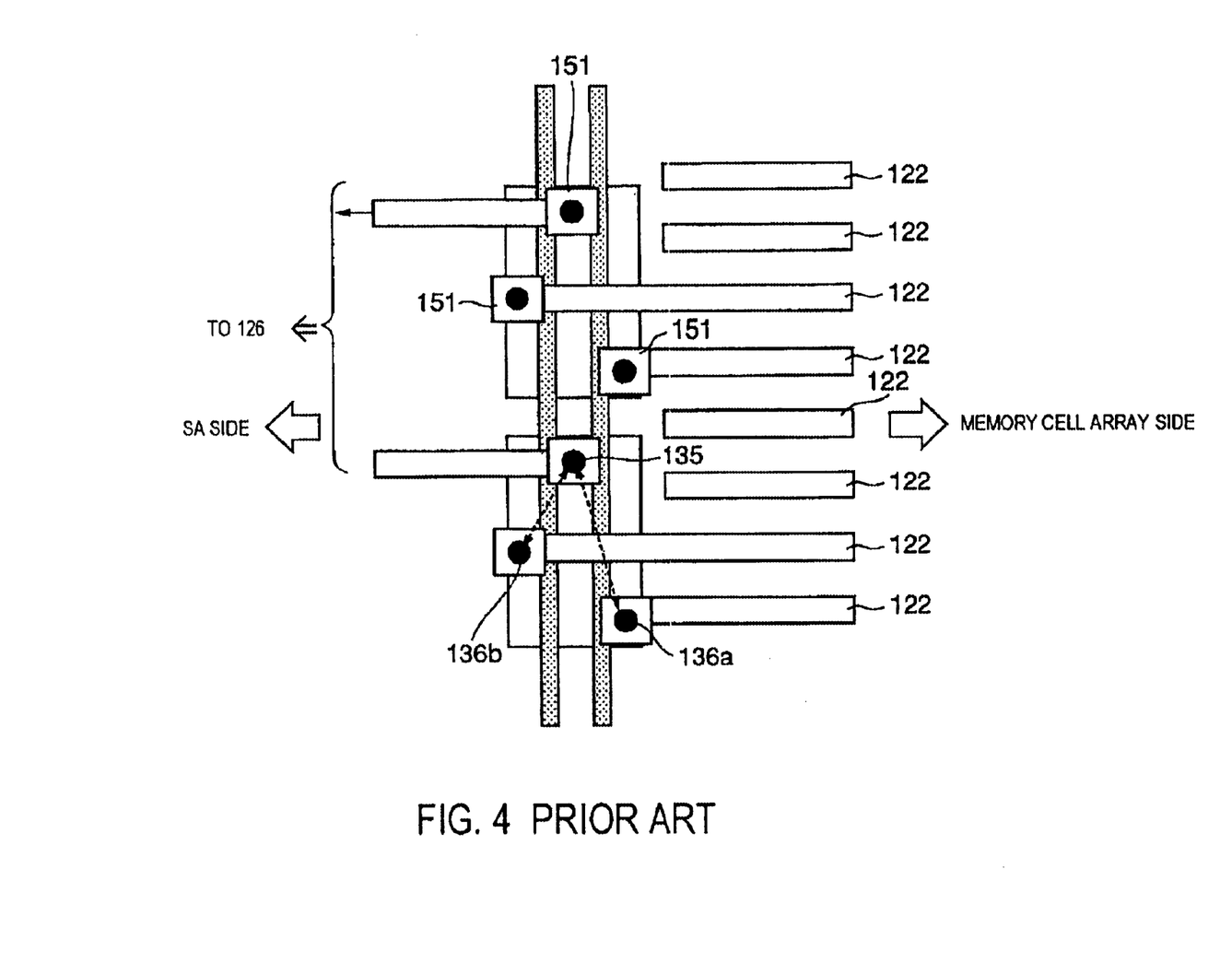
FIG. 4 shows the layout of switches in the semiconductor memory device of FIG. 3.

To solve these problems, it is supposed that sense amplifiers are arranged on both sides of the memory cell array as shown in FIG. 3. Thereby, as shown in FIG. 4 by adoption of this configuration, spaces required for formation of the dog-bones 151 can be ensured without the intervals between the bit lines 122 being increased, and the contact resistances can be reduced. The technique by which sense amplifiers are arranged on both sides of a memory array is described, e.g., in Japanese Unexamined Patent Publication No. 2001-143463.

Figure 5:
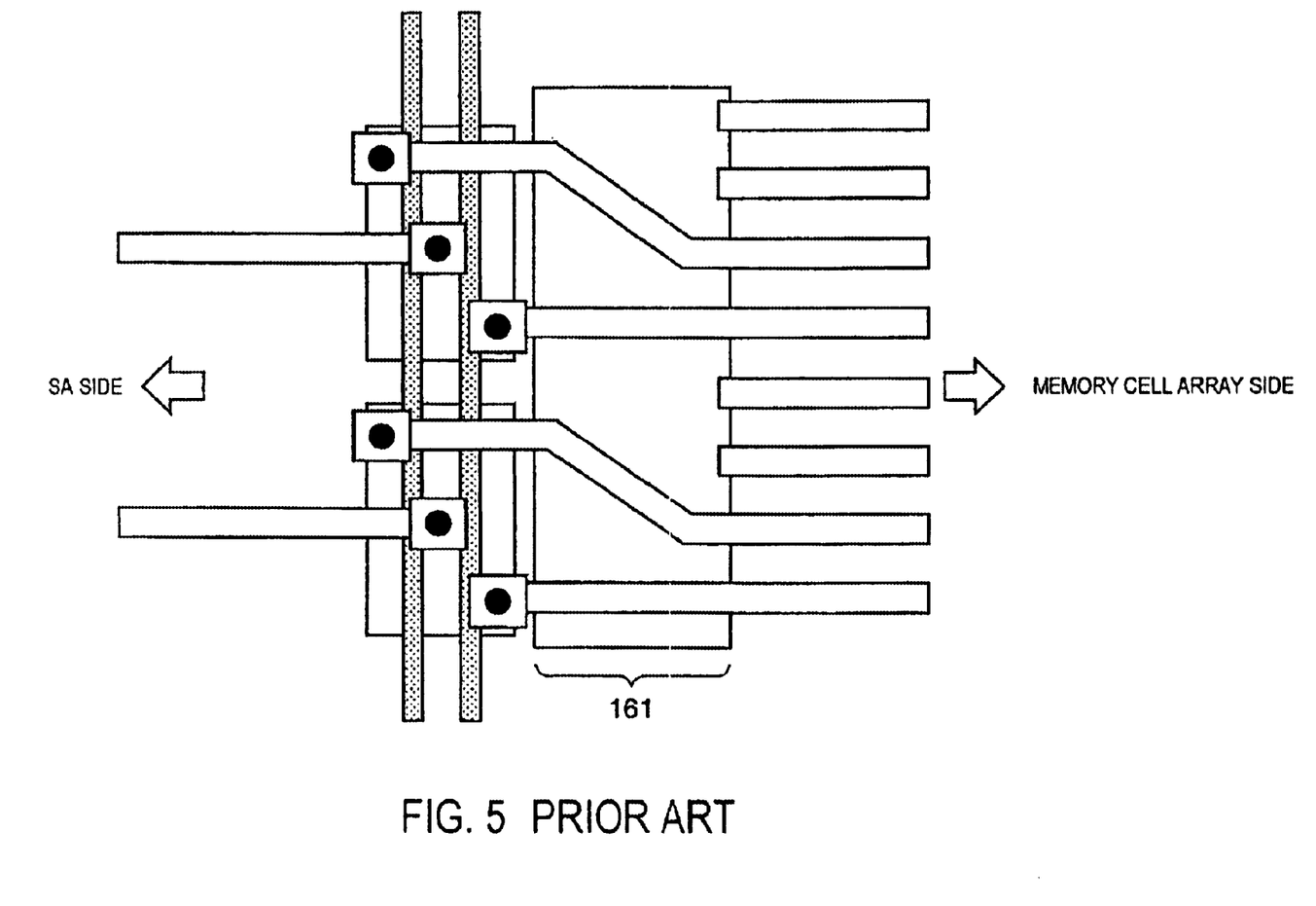
FIG. 5 shows the layout of switches which have solved the problems of the semiconductor memory device of FIG. 4.

However, in the case in whit& the configuration is employed, the interval between the contact 135 and the contact 136a and that between the contact 135 and the contact 136b are more different from each other, an soon in the comparison of FIG. 4 with FIG. 2. That is, this configuration has problems in that the difference between the on-resistances of the two switches 124 of each integration type MOS transistor 134 becomes larger. Accordingly, to eliminate the difference between the on-resistances of the two switches, it is necessary to provide a region required for laying a bit line in a curved pattern, as shown in FIG. 5. This is a new problem.

SUMMARY OF THE INVENTION

Accordingly, it in an object of the present invention to provide a semiconductor memory device in which the area required for arrangement of switches connected to bit lines is small, the on-resistances of the switches are equal, and the contact resistances of the switches are low.

According to the present invention, there is provided a semiconductor memory device which comprises a memory array having a plurality of word-lines arranged in a predetermined direction and in parallel to each other, a plurality of bit lines arranged orthogonally to a plurality of the word-lines and in parallel to each other, and a plurality of memory cells arranged at predetermined intersection points of a plurality of the word-lines and a plurality of the bit-lines, the nether of the predetermined intersection points being equal to half of all the intersection points, a plurality of switches connected to one-side end of the bit-lines provided at an odd-numbered position of a plurality of the bit-lines and connected to the other-side end of the bit-line provided at an even-numbered position, respectively, and a plurality of unit circuits each having two terminal connected to a pair of odd-numbered or even-numbered bit lines of a plurality of the bit lines, the unit circuits being arranged in a column in a predetermined direction in the vicinities to the both ends of a plurality of the bit lines, respectively, the predetermined intersection points being determined in such a manner that when one of a plurality of the word lines is selected, the memory cells of a plurality of the memory cells connected to the selected word line can be electrically connected, one by one, to the terminals of a plurality of the unit circuits.

Preferably, in this semiconductor memory device, when one of a plurality of the word lines is selected, the memory cells connected to the selected word line are operated to be electrically connected to the terminals of the unit circuits.

Also, preferably, a plurality of the switches are MOS transistor switches in which two switches are integrated with each other, respectively.

Preferably, each MOS transistor switch comprises two gate electrodes arranged in parallel to each other, two drain regions formed on both sides of the gate electrodes, independently from each other, and a single source region formed between the two gate electrodes, a pair of the odd-numbered or even-numbered bit lines are connected to the two drain regions, respectively, and a terminal of each unit circuit is connected to the source region.

DESCRIPTION OF THE EMBODIMENTS

Hereinafter, an embodiment of the present invention will be described with reference to the drawings.

Figure 6:
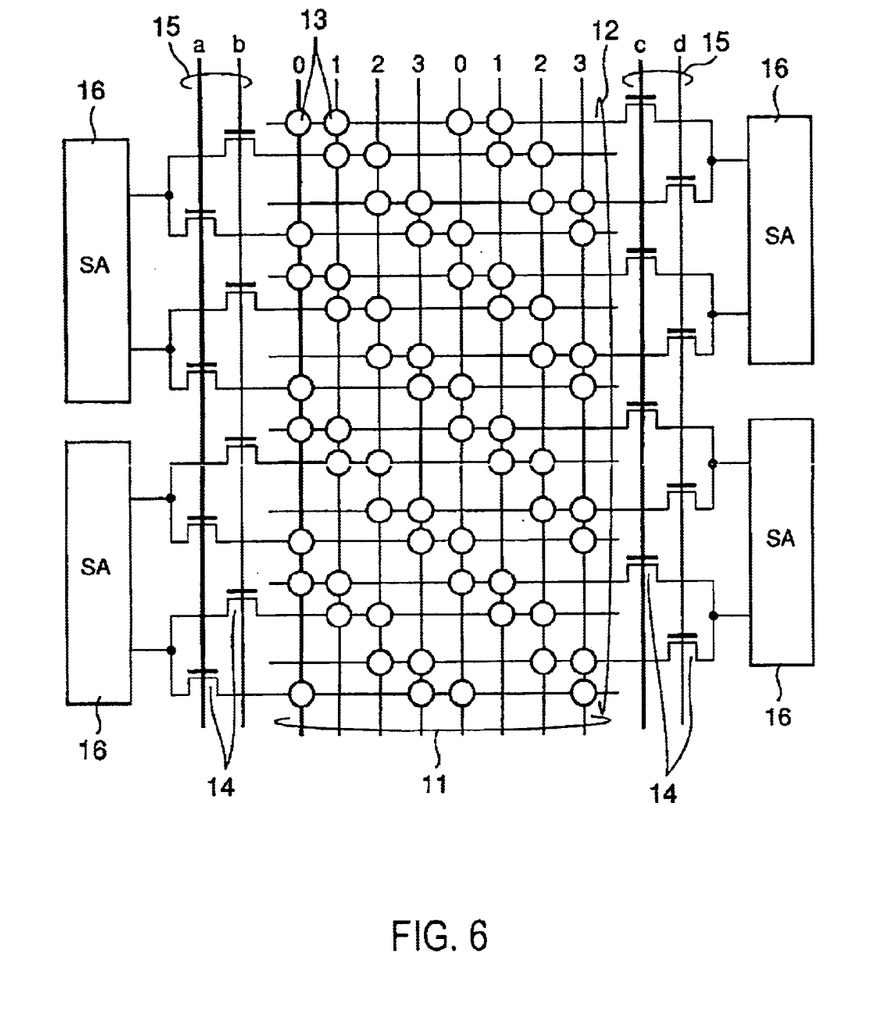
FIG. 6 schematically shows the configuration of a semiconductor memory device according to an embodiment of the present invention.

FIG. 6 schematically shows the configuration of a semiconductor memory device (DRAM: Dynamic Random Access Memory) according to an embodiment of the present invention. This semiconductor memory device comprises a plurality of word lines 11 arranged in the upper-lower direction in FIG. 6 and in parallel to each other, and a plurality of bit lines 12 arranged orthogonally to the word lines 11 and in parallel to each other. Furthermore, the semiconductor memory device has a plurality of memory cells 13 (represented by circular marks in FIG. 6) arranged at predetermined positions, i.e., at intersection points of the word lines and the bit lines of which the number is equal to half of all of the intersection points. Moreover the semiconductor memory device includes transistor switches (bit-line selection switches) 14 connected to the bit-lines 12, respectively, control lines 15 for selectively controlling the transistor switches 14, a plurality of sense amplifiers (SA, also referred to as a unit circuit) 16 connected to the bit linen 12 via the transistor switches 14.

Each of the memory cells 13 comprises one MOS transistor (hereinafter, referred to as a cell-use MOS transistor) and one capacitor. The memory cells 13 are arranged at the intersection points of word lines and bit lines in such a manner that when one word line 11 is selected, the memory cells 13 connected to the selected word line 11 can be connected to the sense amplifiers 16 in which a pair of memory cells 13 are connected to each of the sense amplifiers.

As the cell-use MOS transistor for use in a memory cell 13, a p+ gate nMOS transistor having a gate polySi electrode doped with a p+ impurity is preferable. The reason is as follows.

Figure 7:
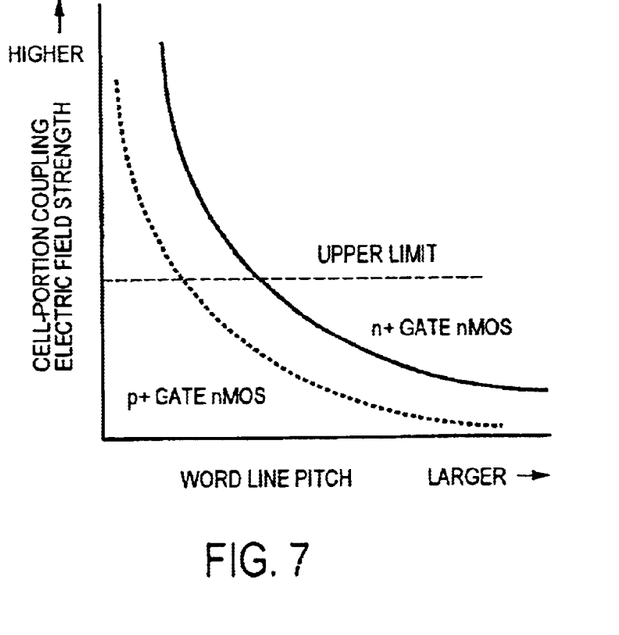
FIG. 7 is a graph showing the word line pitches-cell portion coupling electric field strength characteristics of an n+ gate nMOS transistor and a p+ gate nMOS transistor.

That is, as shown in FIG. 7, when the p+ gate nMOS transistor is used, the coupling electric field strength of a cell-portion is lower than that obtained when the n+ gate nMOS transistor is used on the condition that the word line pitches are equal to each other. The higher the cell-portion coupling electric field strength becomes, the more the cell leak current becomes. Thus, the fluency of refreshing operation has to be increased, so that the consumption power in increased. Accordingly, the consumption power can be suppressed by employment of the p+ gate nMOS transistor when the p+ gate nMOS transistor is used, the word line pitch is smaller than that obtained when the n+ gate MOS transistor is used on the condition that the consumption powers are equal to each other. This means that when the consumption powers are equal, the cell area can be set to be smaller by use of the p+ gate nMOS transistor.

Figure 8:
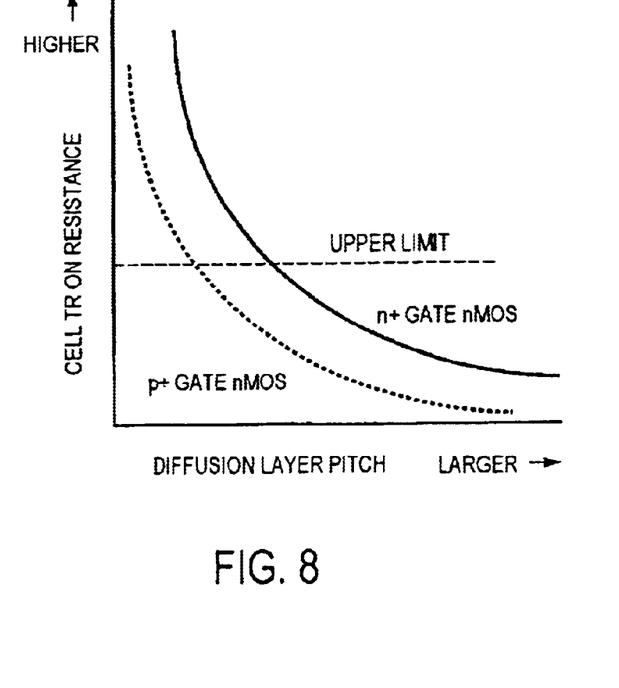
FIG. 8 a is a graph showing the diffusion layer pitches-on-resistance characteristics of the n+ gate nMOS transistor and the p+ gate nMOS transistor.

Moreover, as shown in FIG. 8, the p+ gate nMOS transistor presents a smaller on-resistance than the n+ gate MOS transistor on the condition that the diffusion layer pitches are equal. The larger the on-resistance is, the longer the time required for writing or reading information is. Thus, the operating speed becomes low. Accordingly, the operating speed can be enhanced by employment of the p+ gate nMOS transistor. Moreover, the diffusion layer pitch of the p+ gate nMOS transistor is smaller than that of the n+ gate MOS transistor on the condition that the on-resistances are equal. This means that the cell area can be reduced by employment of the p+ gate nMOS transistor on the condition of the same operating speeds.

For the above-described reasons, it is preferable to use, as a memory cell 13, the p+ gate nMOS transistor which is formed on a substrate doped into a p-type one and uses, as a gate electrode, a polySi doped with a p-type impurity. The use of the p+ gate nMOS transistor makes it possible to reduce the occupation area of the one memory cell to 0.1 $\mu m^2$ or less.

A semiconductor memory device having memory cells using p+ gate nMOS transistors can be produced without the number of processing steps being increased by forming the peripheral circuits such as the sense amplifiers 16, memory array control circuits (not shown), or the like using CMOS transistors each comprising an no gate MOS transistors and a p+ gate pMOS transistor. The n+ gate NOS transistor is formed on a substrate doped into a p-type one, and uses, as a gate electrode, a polySi layer doped with an n-type impurity. The p+ gate AMOS transistor is formed on a substrate doped into an n-type one and uses, as a gate electrode, a polySi layer doped with a p-type impurity.

The transistor switches 14 are arranged alternately on one side and on the other side of the bit lines 12, not on the same aside end of the bit lines 12. In other words, the transistors 14 to be connected to the bit lines provided at the position odd-numbered from the lower side in FIG. 6 are connected thereto on the left-hand side of the bit-lines. The transistor switches 14 to be connected to the even-numbered bit lines are connected thereto on the right-hand side. The transistor switches 14 arranged on the left side of the bit lines 12 are divided into two groups, and also, the transistor switches 14 arranged on the right side of the bit lines are divided into two groups. Totally, the transistor switches 14 are divided into four groups. For each group, the transistor switches are connected to each other with a common control line 15. Specifically, the control lines 15 are connected to the transistor switches 14 connected to the (4n−m)th bit lines 12 (in which n is a natural number, and m is 3, 2, 1, or 0), respectively.

Each of the sense amplifiers 16 is connected to four adjacent transistor switches 14. Specifically, each sense amplifier 16 has two input terminals, and two transistor switches 14 are connected to each input terminal. In other words, each sense amplifier 16 is connected to four bit lines 12 every two bit lines (i.e., odd-numbered or even-numbered bit lines) via the transistor switches 14.

A total of two memory cells 13 are electrically connected to each sense amplifier 16 by on-off control of the transistor switches 14, in such a manner that one memory cell 13 is connected to the sense amplifier 16 via one input terminal. The sense amplifier 16 writes or reads complementary information which correspond to one bit, in or from the two memory cells 13.

The operation of the semiconductor memory device of FIG. 6 will be described with reference to FIG. 9.

As described above, the semiconductor memory device of FIG. 6 is a twin-cell array in which one-bit information is stored in two array cells 13. The arrangement of memory cells 13 along a bit line 12 may be expressed as repetition of a unit of four word lines (one pitch). In this case, the memory cells 13 connected to one of the adjacent bit lines 12 are arranged so as to be shifted by a quarter of the pitch. Thus, the array is called a quarter pitch array. A pair of the memory cells 13 are connected to the same word line. Thus, this array is a two intersection point type. With this semiconductor memory device, a pair of memory cells 13 can be electrically connected to each sense amplifier 16 by selectively driving the word lines 11 and the control lines 15 according to the table of FIG. 9, so that information is written in or read from the memory cells 13.

In detail, when the word line 11-0 is selected, one memory cell 13 can be electrically connected to each input terminal of the sense amplifiers 16 by selectively driving the control lines 15-a and 15-c. Thus, two memory cells 13 are connected to the two input terminals of each sense amplifier 16. Therefore, complementary information corresponding to one bit can be written or read in or from the memory cells 13.

Moreover, one memory cell 13 can be electrically connected to each input terminal of the sense amplifiers 16 by selecting the control lines 15-b and 15-c when the word line 11-1 is selected, by selecting the control lines 15-b and 15-d when the word line 11-2 is selected, or by selecting the control lines 15-a and 15-d when the word line 11-3 is selected. Thus, information can be written or read in or from all of the memory cells 13.

Figure 9:
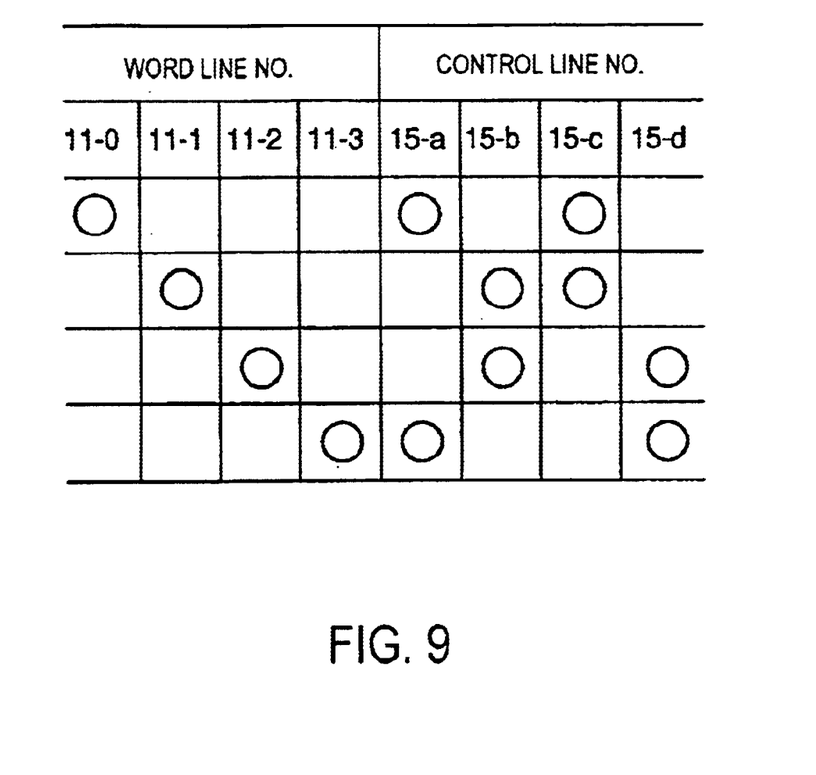
FIG. 9 is a table showing a selection relationship between the word lines and the control lines of the semiconductor memory device of FIG. 6.

In FIG. 9, it is shown which control lines 15 should be selected and driven in the case in which the word line 11-1 is selected. FIG. 9 does not show that at least two word lines 11 to which the sane word line number is assigned are simultaneously selected to be driven.

The switch layout of the semiconductor memory device of FIG. 6 will be described with reference to FIG. 10.

Figure 10:
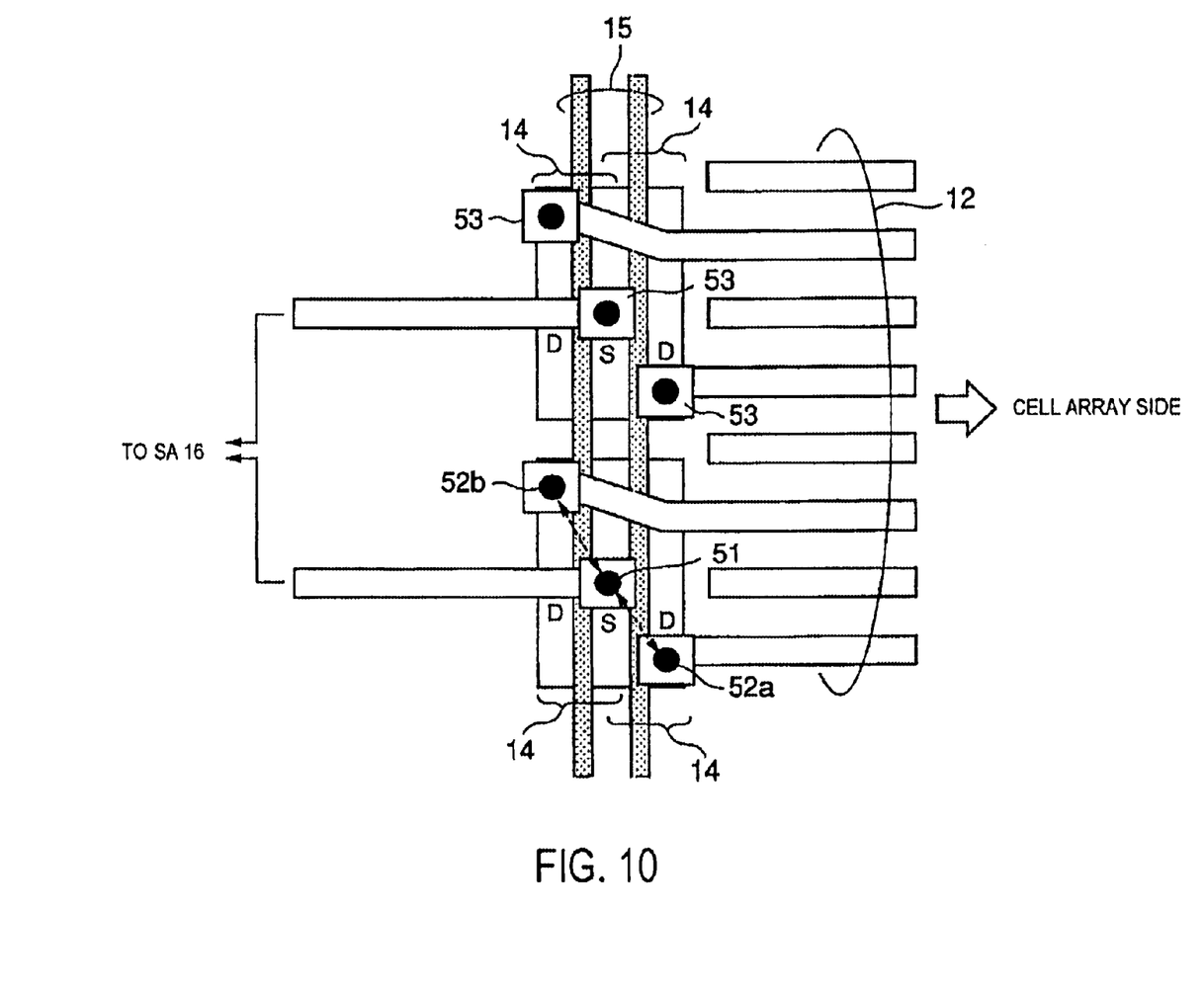
FIG. 10 shows the layout of the switches of the semiconductor memory device shown in FIG. 6.

FIG. 10 shows the layout of four transistor switches 14 connected to a single sense amplifier 16. The four transistor switches 14 are elapsed of a pair of two-integration type MOS transistor switches. That is, each integration type MOS transistor switch includes a single source region (S) and two drain regions (D). Thus, the two transistor switches 14 are integrated with each other.

A connection line connected to one of the input terminals of the sense amplifier 16 is connected to the source region of each integration type MOS transistor switch via a contact 51. Moreover, two bit lines (odd-numbered or even-numbered bit lines) 12, with one bit line 12 being interposed between them, are connected to two drain regions of the integration type MOS transistor switch via contacts 52a and 52b. Dog-bones 53 to reduce the contact resistances are formed in the peripheries of the contacts 51, 52a, and 52b, respectively.

According to the switch layout of FIG. 10, the length in the upper-lower direction of FIG. 10 which can be used to form each MOS transistor switch is equal to the length (width) required for arrangement of four bit lines. Thereby, the size of the MOS transistor can cope with formation of the dog-bones without the whole size of the device being increased.

Moreover, according to the switch layout of FIG. 10, the interval between two bit lines 12 connected to each MOS transistor switch is relatively Large (one bit line exists between them). Therefore, the distance between the contacts 51 and 52a can be set to be equal to that between the contacts 51 and 52b without the end portion of the bit lines 12 being laid in a largely curved pattern. In the example of FIG. 10, the distances between the contacts 51 and 52a and between the contacts 51 and 52b are made to be equal by slightly beading one of two bit lines 12 connected to each MOS transistor.

As described above, according to the semiconductor memory device of this embodiment, the contact resistances can be reduced by formation of the dog-bones in the contacts of the switches connected to the bit lines without the whole size of the device being increased. Thereby, the operating speed can be enhanced, and the consumption power can be reduced.

Moreover, in the semiconductor memory device of this embodiment, the on-resistance of the switches connected to the bit lines can be set to be uniform. Thus, the margin for operation design is increased.

Hereinafter, a method for testing the memory cells of the semiconductor memory device of FIG. 6 will be described with reference to FIG. 11 to FIG. 13C.

Figure 11:
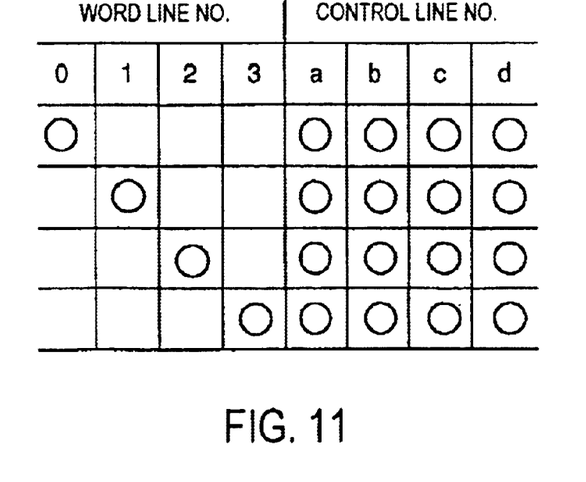
FIG. 11 is a table showing a selection relationship between the word lines and the control lines employed when the semiconductor memory device of FIG. 6 is tested.

First, a testing method for detection of cells of which the margin with respect to holding information will be described. This test is carried out by selectively driving the word lines 11 and the control lines 15 as shown in FIG. 11. That is, the effects of the parasitic capacitances of the bit lines 12 are increased by selectively driving the word lines 11 sequentially one by one and selectively driving all of the control lines 15, so that the signal quantities from memory cells 13, which are testing object, is relatively reduced. Thus, a memory cell 13 having small margin with resect to the holding of the information is detected.

Figure 12:
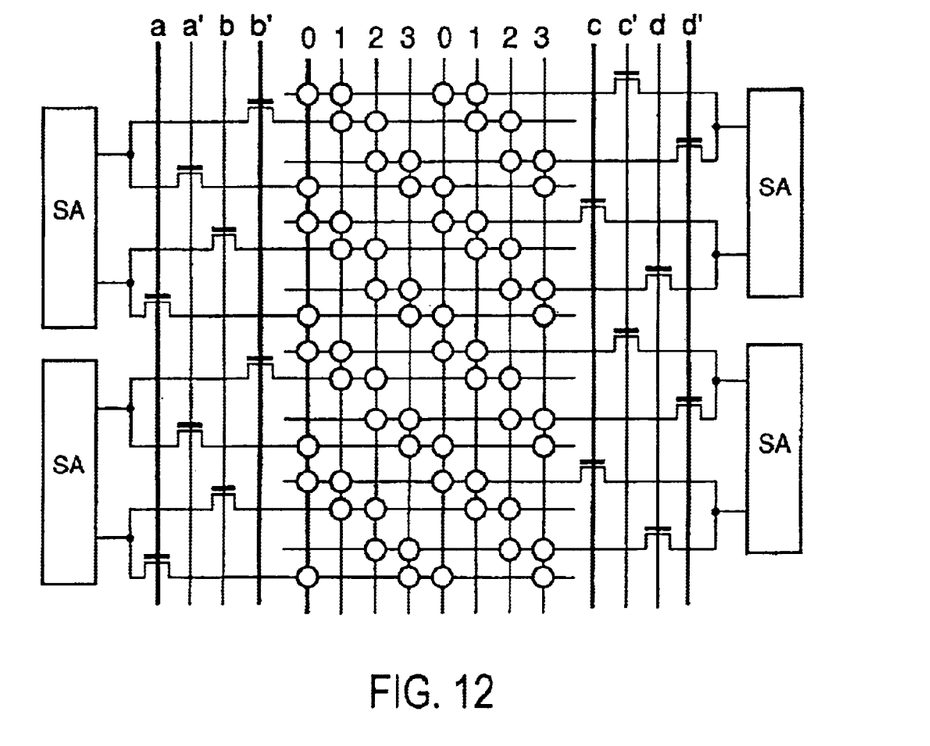
FIG. 12 shows the connection of the control lines made when another test on the semiconductor memory device of FIG. 6 is carried out.

Next, a testing method will be described, in which a deficient cell which can not be detected by the twin cell operation is detected by the single cell operation. In this case, eight control lines 15 connected to the transistor switches 14 are required as shown in FIG. 12.

Figure 13A:
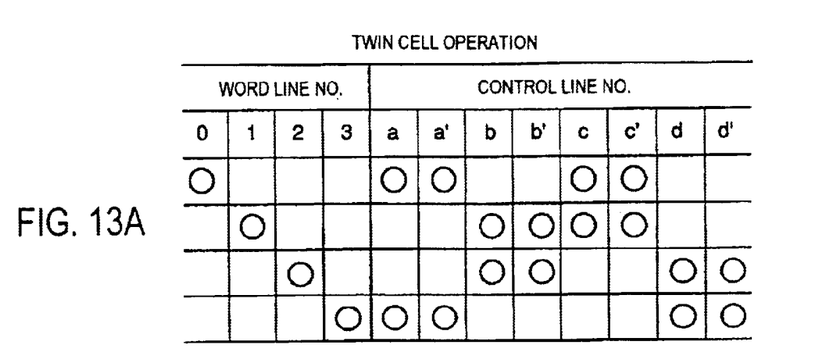
FIGS. 13A, 13B, and 13C show selection relationships between the word lines and the control lines employed when the test on the semiconductor memory device of FIG. 12 in carried out.

In this test, first, the twin cell operation is carried out by selectively driving the word lines 11 and the control lines 15 as shown in FIG. 13A. This operation is the same as the selective operation in accordance with the table of FIG. 9.

Figure 13B:
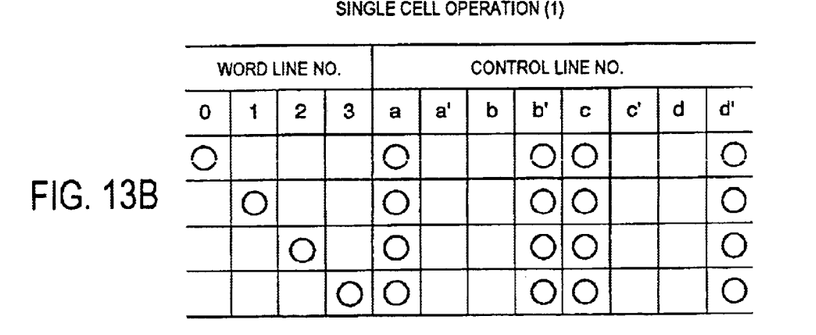
Figure 13C:
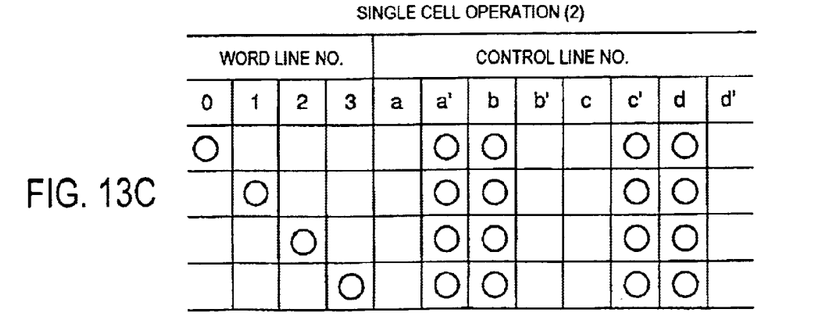

Subsequently, the word lines 11 and the control lines 15 are selected and driven as shown in FIG. 13B. That is, the control lines 15-a, 15-b', 15-c, and 15-d' are simultaneously selected and driven while the word lines are sequentially selected one by one. Thereby, the memory cell 13 is electrically connected to only one of the two input terminals of each sense amplifier 16. Subsequently, the word lines 11 and the control lines 15 are selected and driven as shown irk FIG. 13C, so that the memory cells 13, which have not been connected to the sense amplifiers 16 by the selective driving in accordance with FIG. 13B, are connected to the sense amplifiers 16 one by one.

Such a deficient memory cell 13 as can not be detected by the twin cell operation can be detected as described above.

Figure 14:
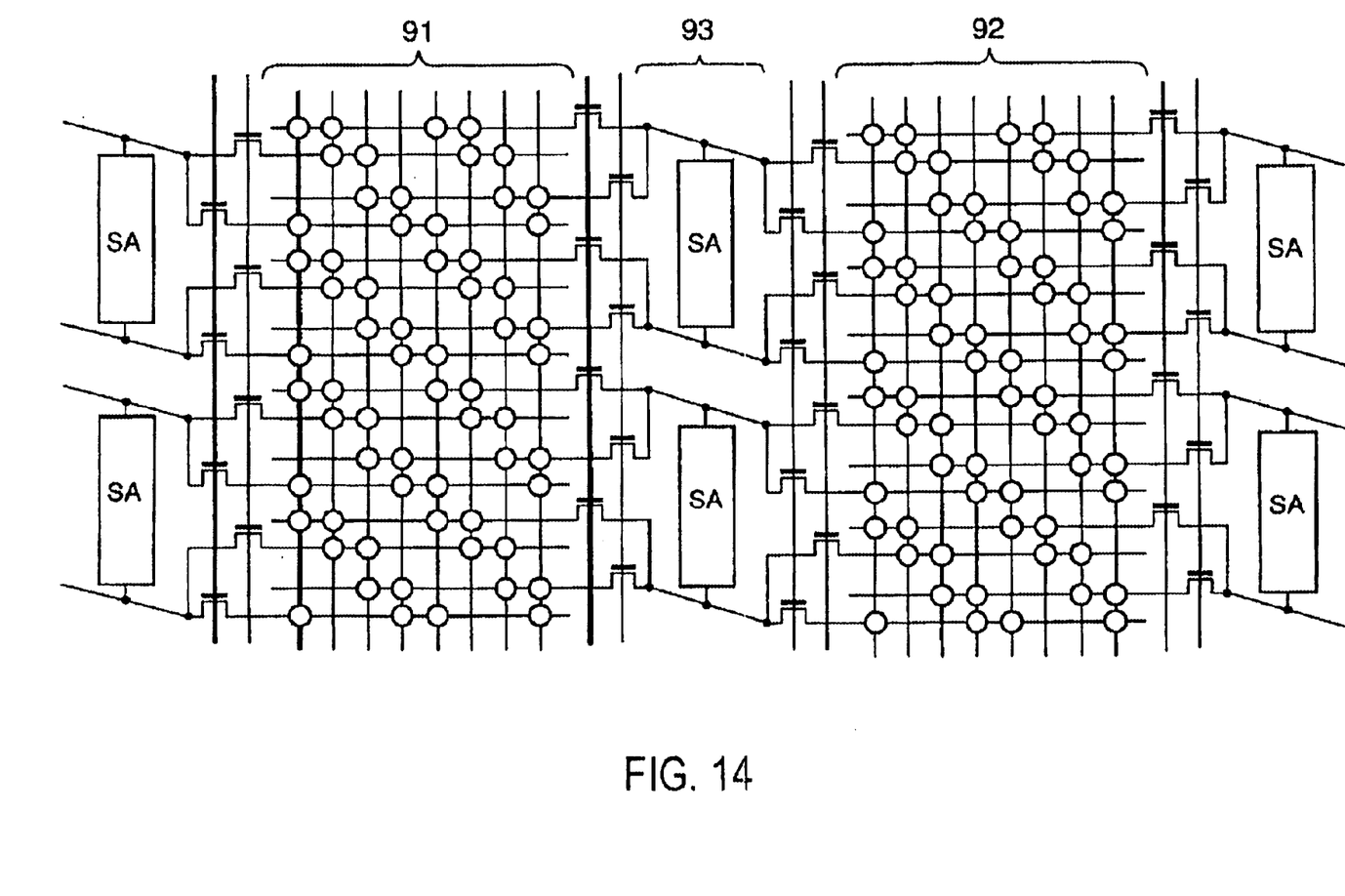
FIG. 14 schematically shows the configuration of the semiconductor memory device of the present invention which is applied to a common sense amplifier system.
Figure 15:
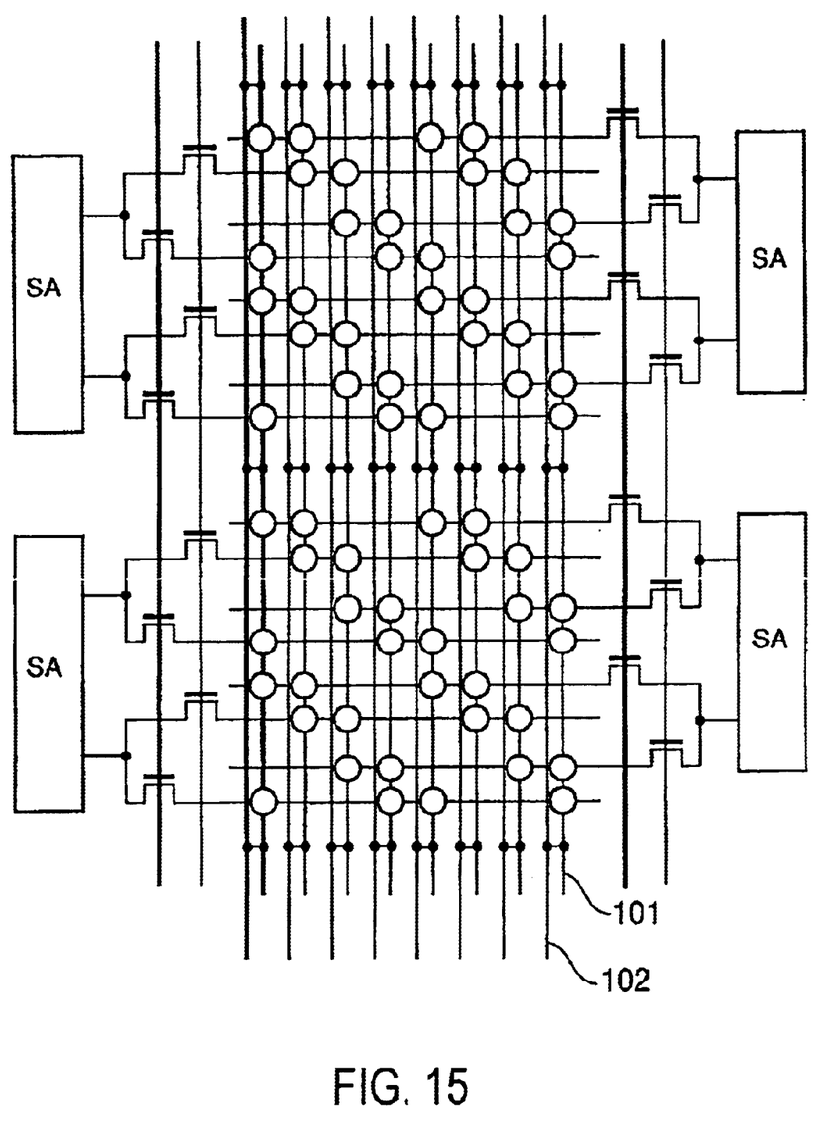
FIG. 15 shows an example of the configuration of the word lines of the semiconductor memory device of FIG. 6.
Figure 16:
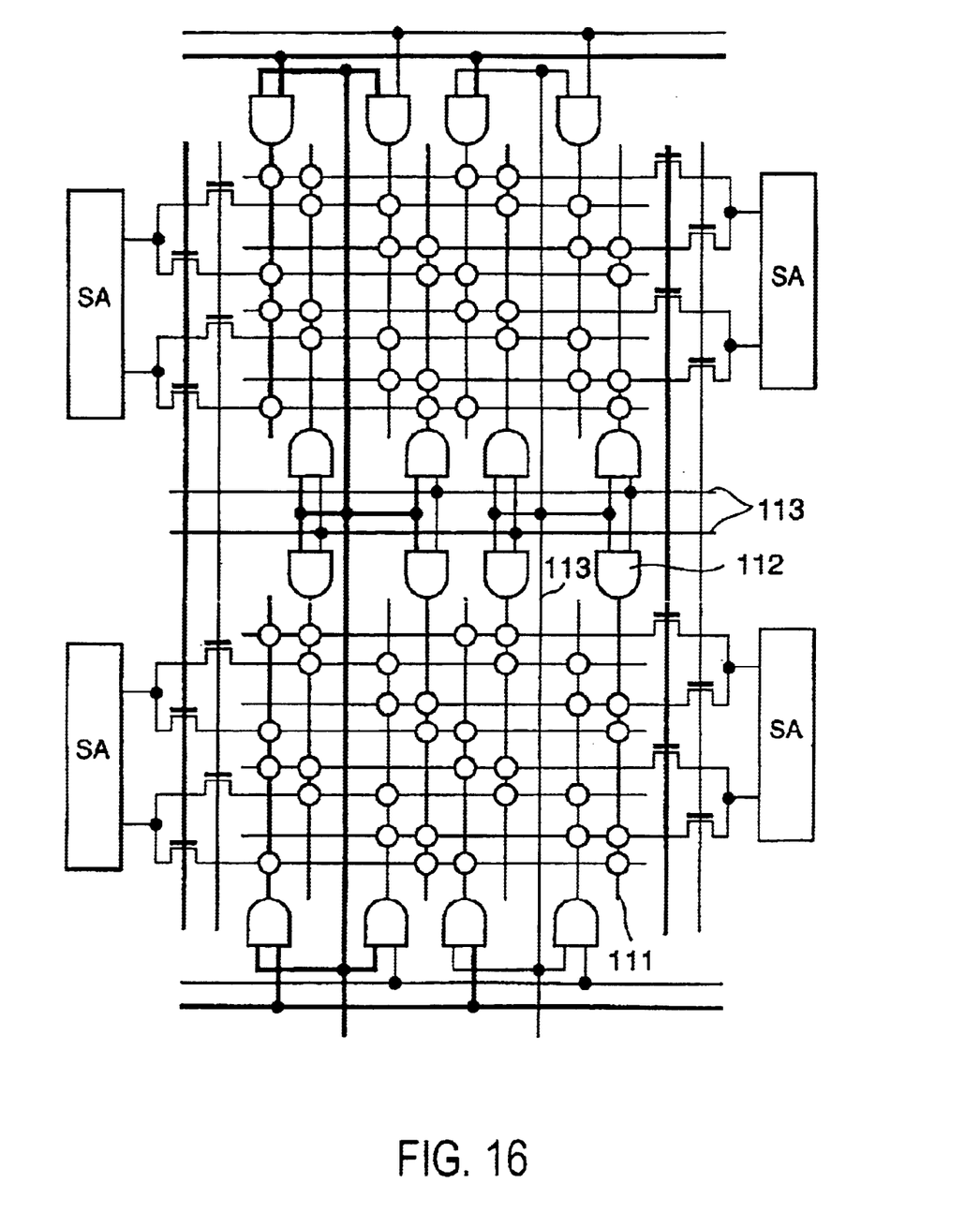
FIG. 16 shows another configuration of the word lines in the semiconductor memory device of FIG. 6.

The semiconductor memory device of the present invention has been described based on the embodiments. The present invention is not restricted on the embodiments. For example, as shown in FIG. 14, the semiconductor memory device of the present invention may be a semiconductor memory device of a common sense amplifier system in which two memory arrays 91 and 92 have one column of sense amplifiers 93 in common. Also, as shown in FIG. 15, the word lines 11 may be driven by main word lines 102, at several points thereof, backed with sub word lines 101 which are the gate electrodes of cell-use MOS transistors. First and second wiring layers are used for the sub word lines 101 and the main word lines 102, respectively. The main word lines 102 (or the second wiring layer) have a smaller resistance than the sub word lines 101 (or the first wiring layer). Moreover, as shown in FIG. 16, sub word lines 111 way be the gate electrodes of cell-use MOS transistors, and drive circuits (AND circuits) 112 for driving the sub word lines 111 may be driven by main word lines 113 having lower resistance than the sub word lines 11. First and second wiring layers are used for the sub word lines 111 and the maximum word lines 113, respectively. In this case, preferably, the length of the sub word lines 111 is to be set as small as possible, and that of the main word lines 113 is set to be as large as possible.

According to the present invention, of the bit lines for use in the memory array, the switches are connected to one-side ends of the odd-numbered bit lines and are connected to the other-side end of the even-numbered bit lines, respectively. The unit circuits are arranged on both sides of the memory array in such a manner that a pair of odd-numbered or even-numbered bit lines are connected to the two terminals via the switches, respectively. The memory cell array is arranged in such a manner that when one of the word lines used in the memory array is selected, the memory cells connected to the word line can be electrically connected to the terminals of the unit circuits in such a manner that one memory cell is connected to each terminal. Thus, a semiconductor memory device can be provided in which the contact resistances of the switches are low, and more over, the on-resistances are uniform, although the area required for the arrangement of the switches connected to the bit lines is small.

What is claimed is:

1. A semiconductor memory device comprises:
   a memory array having plurality of word-lines arranged in a predetermined direction and in parallel to each other, a plurality of bit lines arranged orthogonally to a plurality of the word-lines and in parallel to each other, and a plurality of memory cells arranged at predetermined intersection points of a plurality of the word-lines and a plurality of the bit-lines, the number of the predetermined intersection points being equal to half of all the intersection points;
   a plurality of switches connected to one-side end of the bit-lines provided at an odd-numbered position of a plurality of the bit-lines and connected to the other-side end of the bit-line provided at an even-numbered position, respectively; and
   a plurality of unit circuits each having two terminal connected to a pair of odd-numbered or even-numbered bit lines of a plurality of the bit lines, the unit circuits being arranged in a column in a predetermined direction in the vicinities to the both ends of a plurality of the bit lies, respectively,
   the predetermined intersection points being determined in such a manner that when one of a plurality of the word lines is selected, the memory cells of a plurality of the memory cells connected to the selected word line can be electrically connected, one by one, to the terminals of a plurality of the unit circuit.

2. A semiconductor memory device according to claim 1, wherein when one of a plurality of the word lines is selected, the switches operates so that the memory cells connected to the selected word line are electrically connected to the terminals of the unit circuits, respectively.

3. A semiconductor memory device according to claim 1, wherein a plurality of the switches are MOS transistor switches in which two switches are integrated with each other, respectively.

4. A semiconductor memory device according to claim 3, wherein each MOS transistor switch contains two gate electrodes arranged in parallel to each other, two drain regions formed on both sides of the gate electrodes, independently from each other, and a single source region formed between the two gate electrodes, a pair of the odd-numbered or even-numbered bit lines are connected to the two drain regions, respectively, and a terminal of each unit circuit is connected to the source region.

5. A semiconductor memory device according to claim 1, wherein each memory cell comprises one cell-use MOS transistor and one capacitor.

6. A semiconductor memory device according to claim 5, wherein the cell-use MOS transistor is formed on a substrate doped into a p-type, and contains as a gate electrode a polySi layer doped with a p-type impurity.

7. A semiconductor memory device according to claim 6, wherein each unit circuit contains a first MOS transistor which is formed on a substrate doped into a p-type and has a first polySi layer doped with a n-type impurity, and a second MOS transistor which is formed on a substrate doped into a n-type and has as a gate electrode a second polySi layer doped with a p-type impurity.

8. A semiconductor memory device according to claim 6, further comprising a peripheral circuit for controlling the cell array and a plurality of the switches, the peripheral circuit containing a first MOS transistor which is formed on a substrate doped into a p-type, and has as a gate electrode a first polySi layer doped with an n-type impurity, and a second MOS transistor which is formed on a substrate doped into an n-type, and has as a gate electrode a second polySi layer doped with an p-type impurity.

9. A semiconductor memory device according to claim 5, wherein each word line comprises a first wiring layer using for the gate electrode of the cell-use MOS transistor and a second wiring layer having a lower resistance than the first wiring layer and backing the first wiring layer at predetermined positions.

10. A semiconductor memory device according to claim 5, wherein each word line comprises a first wiring layer using for the gate electrode of the cell-use MOS transistor, a drive circuit for driving the first wiring layer, and a second wiring layer connected to the drive circuit and having a lower resistance than the first wiring layer.

11. A semiconductor memory device according to claim 1, wherein the unit circuits are connected, in addition to the above-described memory cell array, to another memory cell array having the same constitution as the above-described memory cell array.

12. A method of testing the semiconductor memory device defined in claim 1 comprising the step of: selecting a plurality of the word lines sequentially one by one, and turning-on all of a plurality of the switches.

13. A method of testing the semiconductor memory device defined in claim 1 comprising the steps of; selecting a plurality of the word lines sequentially one by one, and controlling a plurality of the switches so that the memory cell is electrically connected to only one terminal of each of a plurality of the unit circuits: and     thereafter, again, selecting a plurality of the word lines sequentially one by one, and controlling a plurality of the switches so that the memory cell is electrically connected to only the other terminal of each of a plurality of the unit circuits.

\* \* \* \* \*